(12) United States Patent
Tao et al.

(10) Patent No.: US 6,300,166 B1
(45) Date of Patent: Oct. 9, 2001

(54) METHOD FOR PACKAGING A BGA AND THE STRUCTURE OF A SUBSTRATE FOR USE WITH THE METHOD

(75) Inventors: Su Tao, Kaohsiung; Yu-Ching Tsai, Kaohsiung Hsien; Meng-Hui Lin, Kaohsiung; Chin-Ming Chung, Kaohsiung Hsien, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/385,921

(22) Filed: Aug. 30, 1999

(51) Int. Cl.[7] .......................... H01L 21/44; H01L 21/48; H01L 21/50
(52) U.S. Cl. .................. 438/121; 438/127; 257/187; 257/676
(58) Field of Search .................. 257/787, 666, 257/783; 438/121, 111, 108, 126, 127

(56) References Cited

U.S. PATENT DOCUMENTS 5,834,837 * 11/1998 Song .
6,013,947 * 1/2000 Lim .
6,025,640 * 2/2000 Yagi et al. .

* cited by examiner

Primary Examiner—Sheila V. Clark

(57) ABSTRACT

A method for packaging a BGA and the structure of the BGA for using the method are disclosed. The structure of the substrate of the BGA includes multiple pairs of aligned slots (11, 12) defined along the X-axis thereof, and a passage (13) corresponding to and perpendicular to one pair of aligned slots (11, 12). While using the method to package the substrate, one side of the substrate will be entirely covered by a first protective layer to protect the chips and the other side of the substrate will form multiple lines of a second protective layers to protect the bonding wires.

2 Claims, 4 Drawing Sheets

METHOD FOR PACKAGING A BGA AND THE STRUCTURE OF A SUBSTRATE FOR USE WITH THE METHOD

BACKGROUND OF THE INVENTION

1. Field of the Invention

The present invention relates to a method for packaging a Ball Grid Array (BGA), and more particularly to a method that uses a mold to package a BGA. With this arrangement and structure of the BGA, the production efficiency and the heat dissipation effect will increase dramatically.

2. Description of Related Art

Referring to FIG. 5, a conventional substrate (80) for packaging a Ball Grid Array is shown. The substrate (80) has slots (801) defined therein. A layer of tape (81) is provided around each of the slots (801) to secure the chip (not shown). After the chip is securely bonded to the substrate (80) by means of the gel on the tape (81), the process of wire bonding is then ready to be performed to complete the package. A shown in FIG. 6, each of the chips (82) securely bonded to the substrate (80) has a line of pads (820) securely mounted thereunder. The line of the pads (820) corresponds to one of the slots (801). Thereafter, metal wires (821) are bonded to connect the pads (820) with the substrate (80).

After the process of wire bonding is completed, the process of packaging is initiated. The aforementioned BGA components are packaged by gel (84) spread around each one of the chips (82) and filled in the slots (801), so as that the chips (82) are protected from damage by the solidified gel (84). Then solder balls (83) are provided under the substrate (80) to connect with the circuit of the substrate (80) so as to form a bare-chip Ball Grid Array.

The above description depicts the basic structure of the bare-chip BGA. However, such a structure suffers from a number of shortcomings:

1. low production efficiency

Since the distribution of the gel (84) is labor intensive, the time required to complete the BGA package is excessive, which results in low production efficiency.

2. insufficient protection

The bare-chip BGA chips (82) are only protected by the solidified gel (84). The protection to the chips (82) provided by the gel (84) is not sufficient to avoid damage to the chips (82).

3. low heat dissipation efficiency

The heat dissipation of this bare-chip BGA depends only on the exposed surfaces of the chips (82), which are in contact with the air. As for the dissipation of the extra heat, the bare-chip BGA will not be able to dissipate the heat effectively.

It is therefore an objective of the invention to provide a method for packaging the BGA and the structure of the substrate for accomplishing the packing.

The present invention intends to provide a method for packaging a BGA and the structure of the substrate to accomplish the packaging to mitigate and/or obviate the aforementioned problems.

SUMMARY OF THE INVENTION

The main objective of the invention is to provide a method for packaging a BGA. With such a method, the process of packaging the BGA can be completed quickly, and the chips that are securely mounted on the substrate are able to be well protected.

Another objective of the invention is to increase the heat dissipation effectiveness of the packaged BGA. Because the chips on the substrate are fully covered by the gel and the solidified gel effectively conducts and radiates heat, the total heat dissipation surface of the packaged BGA increases, which increases the total heat dissipation capability.

Still, another objective of the invention is to provide an improved method for packaging the substrate. The substrate has multiple aligned slots parallel with each other and a passage corresponding to each of the aligned slots. With such an arrangement, the chips mounted on the substrate are protected by the gel flowing from the inlet of an upper mold. Furthermore, the pads and the bonding wires mounted underneath the substrate are able to covered by the gel flowing into the slots in the lower mold.

DETAILED DESCRIPTION OF THE PREFERRED EMBODIMENT

Figure 1:
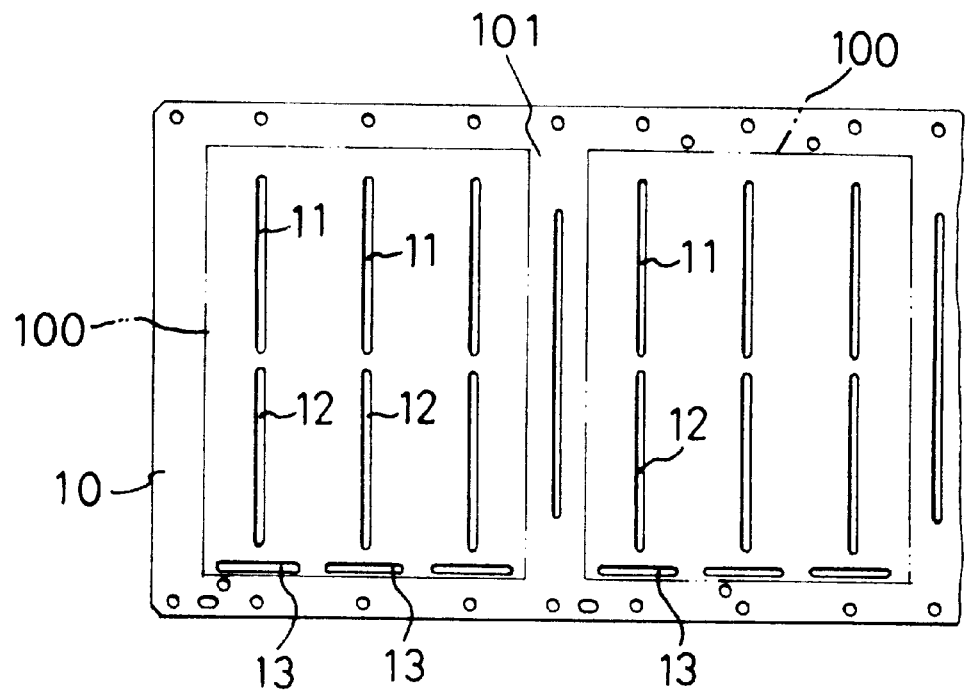
FIG. 1 is a top plan view of a BGA substrate in accordance with the present invention.

Referring to FIG. 1, a substrate (10) for a Ball Grid Array (BGA) has multiple pairs of aligned slots (11, 12) defined along the X-axis thereof and a passage (13) corresponding to and being perpendicular to each pair of the aligned slots (11, 12). A number of pairs of aligned slots (11, 12) are grouped together as a packaging element (100). Packaging elements (100) are separated by a gap (101).

Figure 2:
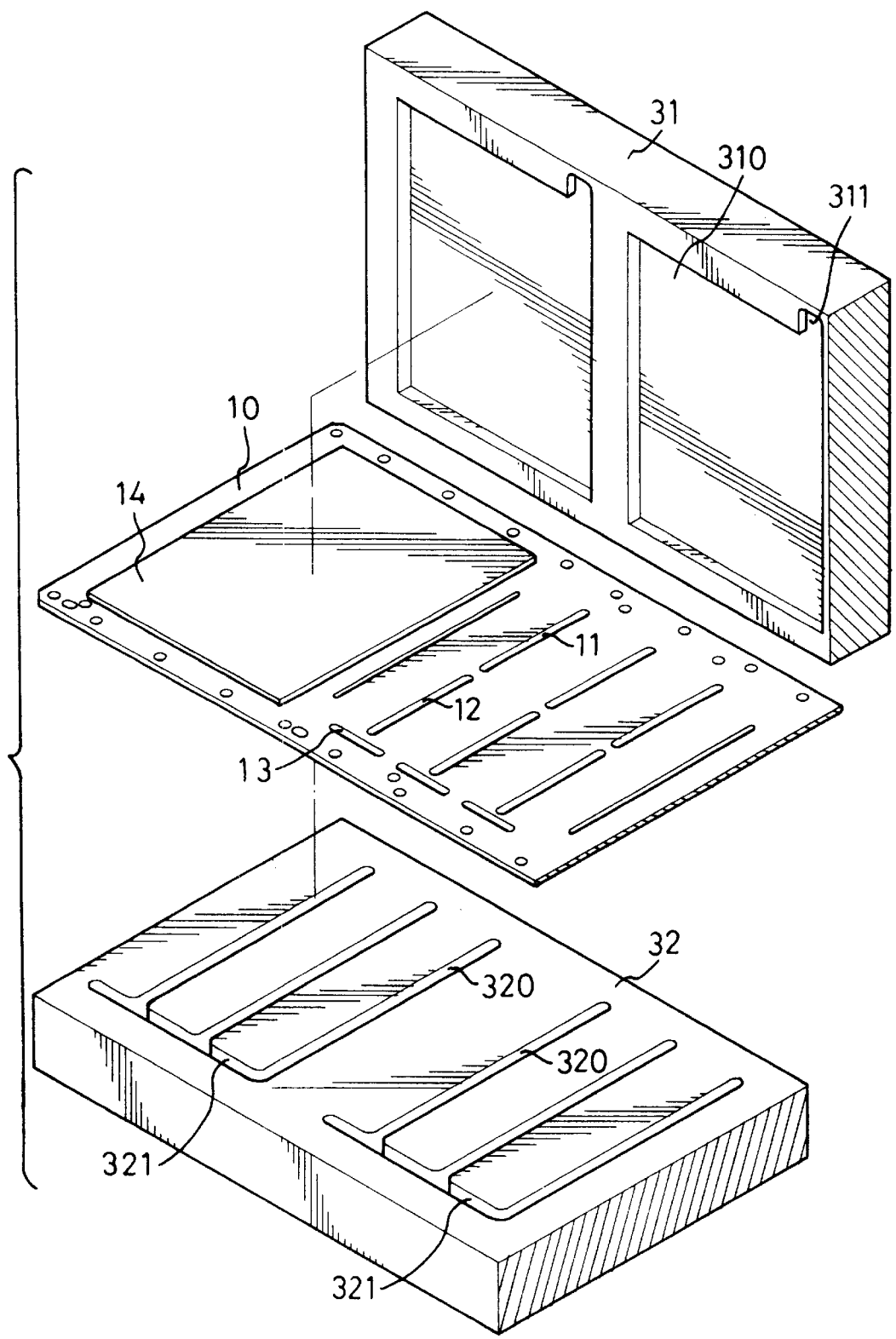
FIG. 2 is an exploded perspective view of a mold used to package the substrate in FIG. 1.

FIG. 2 shows a mold used to package the substrate (10). The mold has an upper mold (31) and a lower mold (32). The upper mold (31) has multiple recesses (310) defined to correspond to a corresponding number of packaging elements (100). In the preferred embodiment, two recesses (310) are defined in the upper mold (31) and two packaging elements (100) are formed on the substrate (10). Each recess (310) further has an inlet (311) defined to communicate therewith.

The lower mold (32) also has a channel (320) corresponding to a pair of the aligned slots (11, 12). Beside the channels (320), the lower mold (32) further has a paths (321) defined to communicate with the channels (320) for the aligned slots (11, 12) and corresponding to the passages (13) of the substrate (10).

Figure 3:
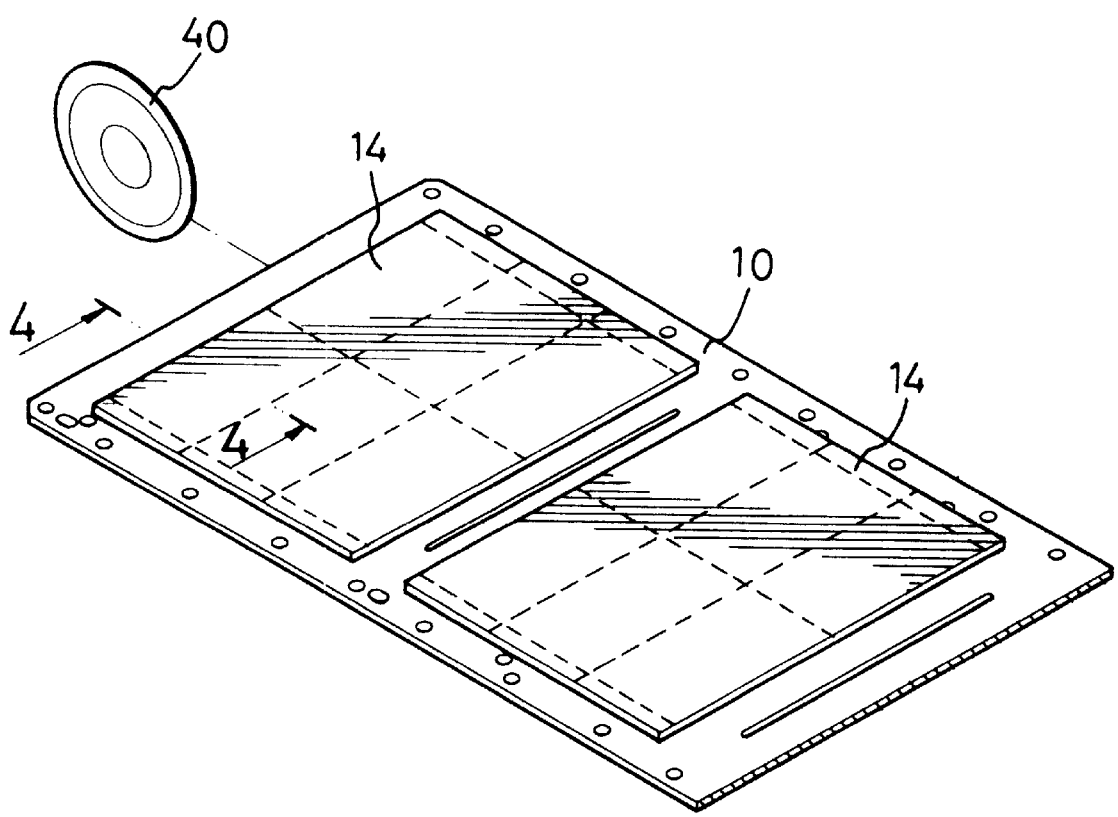
FIG. 3 is a perspective view of the fully packaged substrate in FIG. 1.
Figure 5:
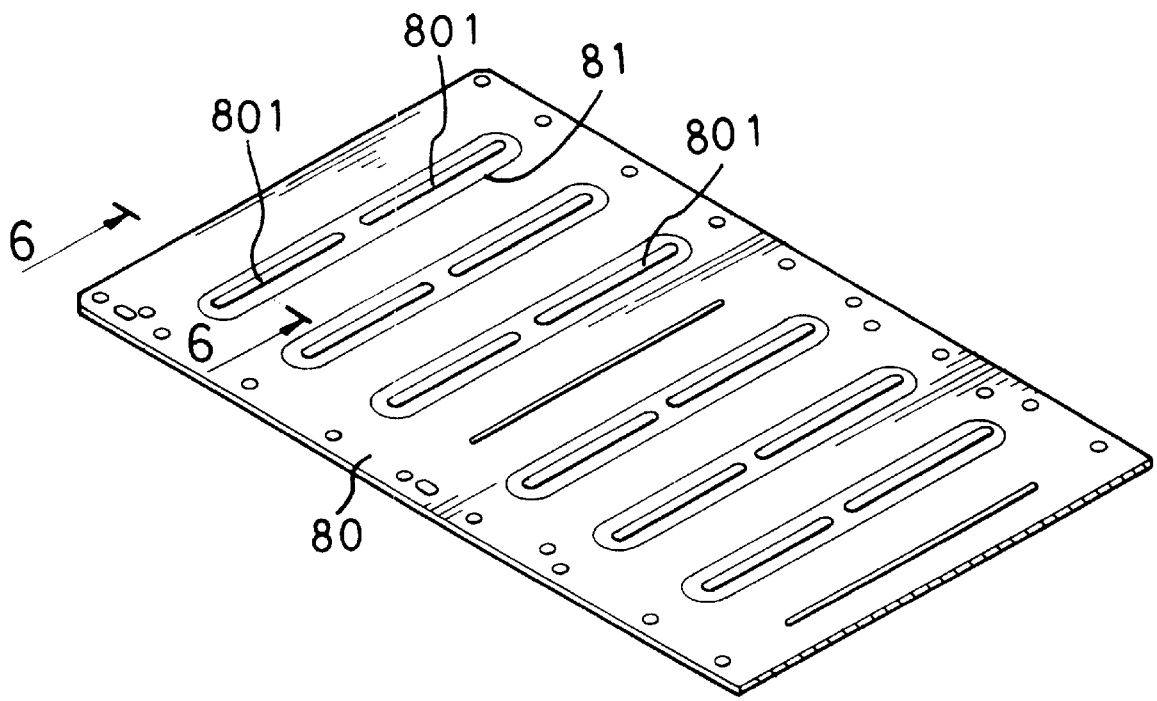
FIG. 5 is a perspective view of a conventional substrate.
Figure 6:
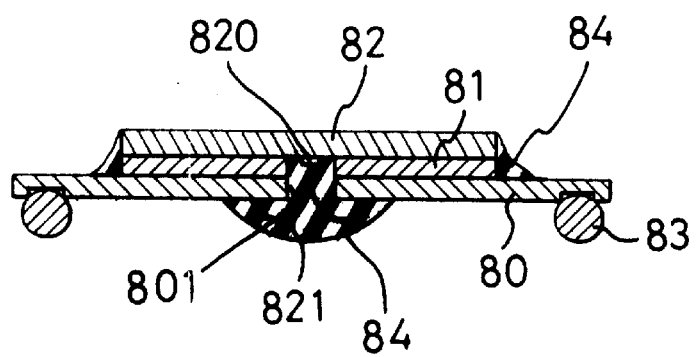
FIG. 6 is a front cross sectional plan view of the conventional packaged BGA along line 6—6 of FIG. 5.

When the chips (82) mounted on the substrate (10) and the wire bonding is completed, the packaging of the substrate (10) is able to be completed by the mold. The substrate (10) is sandwiched between the upper mold (31) and the lower mold (32). After the aligned slots (11,12) and the passages (13) on the substrate (10) are aligned with the channels (321) and the paths (321) in the lower mold (32) respectively, gel is injected from the inlets (311) of the upper mold (31). The gel will then fill in all the recesses (310). The gel will flow to the bottom of the substrate (10) through the slots (11,12) and the passages (13). The channels (320) and the paths (321) will limit the flow of the gel flowing to the bottom of the substrate (10). When the gel in the mold solidifies, the mold is removed. The gel in the recesses (310) forms a first protective layer (14) which covers all over the packaging elements (100) on the substrate (10). Thereafter, a wheel cutter (40), as shown in FIG. 3, is used to cut the packaging elements (100) according to requirements.

Figure 4:
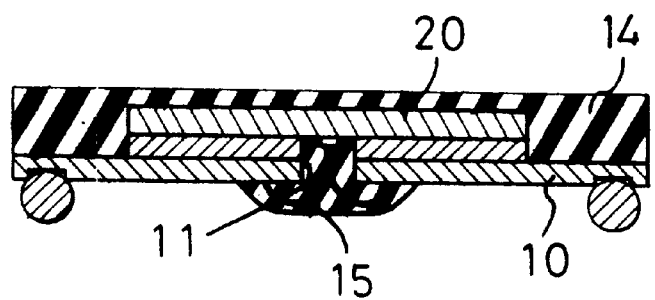
FIG. 4 is a front cross sectional plan view of a fully packaged BGA chip along line 4—4 of FIG. 3.

Referring to FIG. 4, after the molding process on the substrate (10), one side of the substrate (10) is covered with a first protective layer (14) to protect the chips (82). The other side of the substrate (10), , a second protective layer (15) corresponding to the position of the slots (11,12) is formed to protect the bonding wire (not numbered). With this structure of the packaged substrate (10), the chips (82) are entirely covered by the first protective layer (14), such that the total surface which contacts the air increases, which results in an increase in the total heat dissipation efficiency. Furthermore, because the packaging of the substrate (10) is accomplished with the mold, a large number of chips (82) are packaged at the same time, and the production efficiency is improved greatly.

The process of packaging the substrate (10) has the following steps:

1. preparing a substrate that has multiple aligned slots and multiple passages each corresponding to and perpendicular to a pair of the aligned slots;

2. preparing a mold that has an upper mold with multiple recesses each defined to cover multiple aligned slots and having an inlet defined to communicate with the recess and correspond to one of the passages and a lower mold that has a channel defined to correspond to each pair of aligned slots and a path defined to communicate with multiple channels and correspond to the passages of the substrate;

3. injecting gel through the inlets

Due to the communication between the recess and the aligned slots and between the passages and the paths, filling the gel from the inlets will cause a first protective payer to be coated on one side of the substrate and multiple lines of a second protective layer on the other side of the substrate;

4. remove the mold from the substrate; and 5. cutting the substrate into parts

After the substrate is packaged with the solidified gel, the substrate is cut into sizes according to different requirements.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for packaging a BGA, which comprises the following steps:

(1). preparing a substrate that has multiple aligned slots and a passage corresponding to and perpendicular to each pair of aligned slots;

(2). preparing a mold that has an upper mold having multiple recesses each defined to cover multiple aligned slots and having an inlet defined to communicate with each recess and correspond to one of the passages and a lower mold that has channels defined to correspond to each pair of aligned slots and a path defined to communicate with multiple channels and correspond to the passages of the substrate;

(3). injecting gel through the inlets; due to the communication between the recess and the aligned slots and between the passages and the paths, injecting the gel from the inlets will cause a first protective payer to be coated on one side of the substrate and multiple lines of a second protective layer on the other side of the substrate;

(4). removing the mold from the substrate; and (5). cutting the substrate into parts; after the substrate is packaged with the solidified gel, the substrate is cut into sizes according to different requirements.

2. A structure of a BGA substrate used in the method as claimed in claim 1, said substrate having a surface to which a chip is securely attached, comprising:

multiple pairs of aligned slots defined along a first direction of the substrate; and a passage corresponding to a pair of the aligned slots and extending in a second direction substantially perpendicular to the first direction, whereby an encapsulating material is able to flow through the aligned slots and the passage to facilitate package of the substrate.

* * * * *